(12) United States Patent
Yen et al.

(10) Patent No.: US 12,520,385 B2
(45) Date of Patent: Jan. 6, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Wei-Chun Yen, Tainan (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 674 days.

(21) Appl. No.: 17/655,918

(22) Filed: Mar. 22, 2022

(65) Prior Publication Data

US 2023/0309194 A1    Sep. 28, 2023

(51) Int. Cl.
*H05B 1/02* (2006.01)
*G03F 7/00* (2006.01)
*G03F 7/20* (2006.01)
*G05B 13/02* (2006.01)
*H05G 2/00* (2006.01)

(52) U.S. Cl.
CPC ....... *H05B 1/0247* (2013.01); *G03F 7/70033* (2013.01); *G03F 7/70525* (2013.01); *G03F 7/70925* (2013.01); *G05B 13/0265* (2013.01); *H05G 2/0025* (2024.08); *H05G 2/0092* (2024.08); *G03F 7/2004* (2013.01)

(58) Field of Classification Search
CPC . H05B 1/0247; H05B 3/0047; G03F 7/70033; G03F 7/70525; G03F 7/70925; G03F 7/2004; G03F 7/70916; G05B 13/0265; H05G 2/005
See application file for complete search history.

(56) References Cited

U.S. PATENT DOCUMENTS

2010/0176310 A1*  7/2010  Moriya ................. G03F 7/7085
                                                        250/493.1
2011/0310365 A1* 12/2011  Yabu ...................... H05G 2/008
                                                        355/30

(Continued)

OTHER PUBLICATIONS

Wikipedia contributors. "Machine learning." Wikipedia, The Free Encyclopedia. Wikipedia, The Free Encyclopedia, Mar. 21, 2022. Web. Oct. 15, 2024. (Year: 2022).*

*Primary Examiner* — David E Smith
*Assistant Examiner* — Christopher J Gassen
(74) *Attorney, Agent, or Firm* — Harrity & Harrity, LLP

(57) ABSTRACT

Some implementations described herein incorporate a heating system to heat a cover of a bucket. A liquified target material, collected by vanes and/or a transport ring within a vessel of an extreme ultraviolet (EUV) radiation source, flows through a drain port of the transport ring and through a conduit that provides the liquified target material to the bucket through an opening of the cover. By heating the cover, the heating system prevents the liquified target material from solidifying at or near the opening before the liquified target material can flow into the bucket. By preventing the solidifying of the liquid target material, a likelihood of a blockage within the conduit and/or the drain port is reduced.

20 Claims, 10 Drawing Sheets

(56) References Cited

U.S. PATENT DOCUMENTS

| | | | | |
|---|---|---|---|---|
| 2013/0134326 A1* | 5/2013 | Yabu | ............... | G03F 7/70033 |
| | | | | 250/455.11 |
| 2014/0160453 A1* | 6/2014 | Kempen | ............ | H05G 2/006 |
| | | | | 355/53 |
| 2014/0253716 A1* | 9/2014 | Saito | ............ | H05G 2/005 |
| | | | | 348/87 |
| 2015/0338753 A1* | 11/2015 | Riepen | ............ | H05G 2/005 |
| | | | | 250/504 R |
| 2020/0133137 A1* | 4/2020 | Sugisawa | ........... | H05G 2/008 |

\* cited by examiner

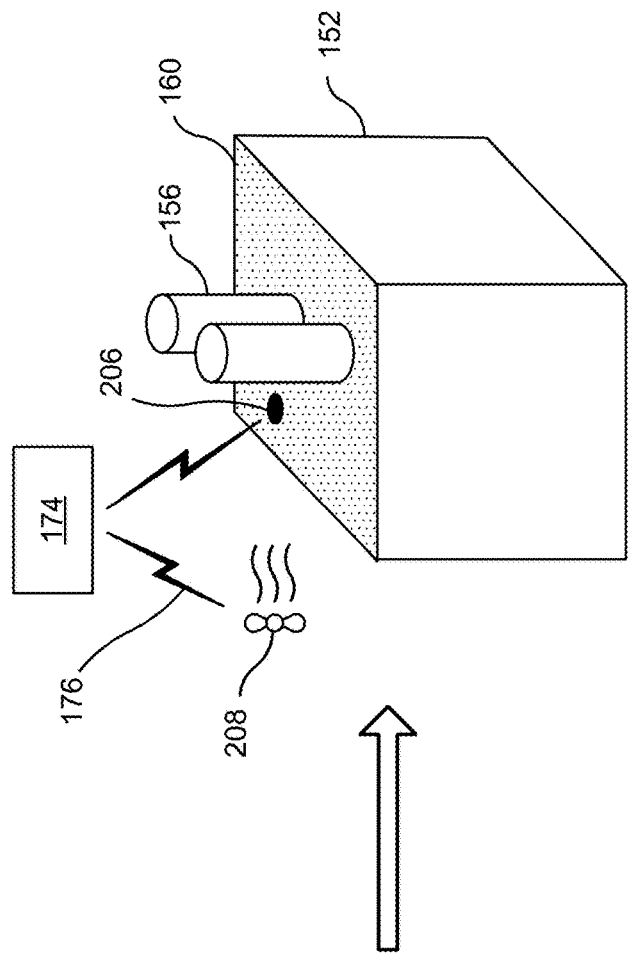
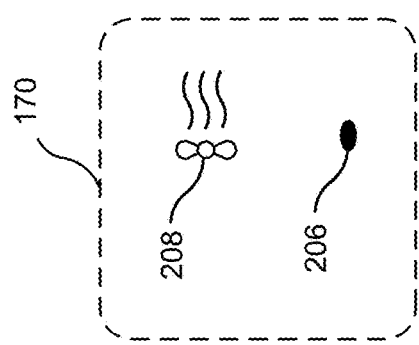
FIG. 2B

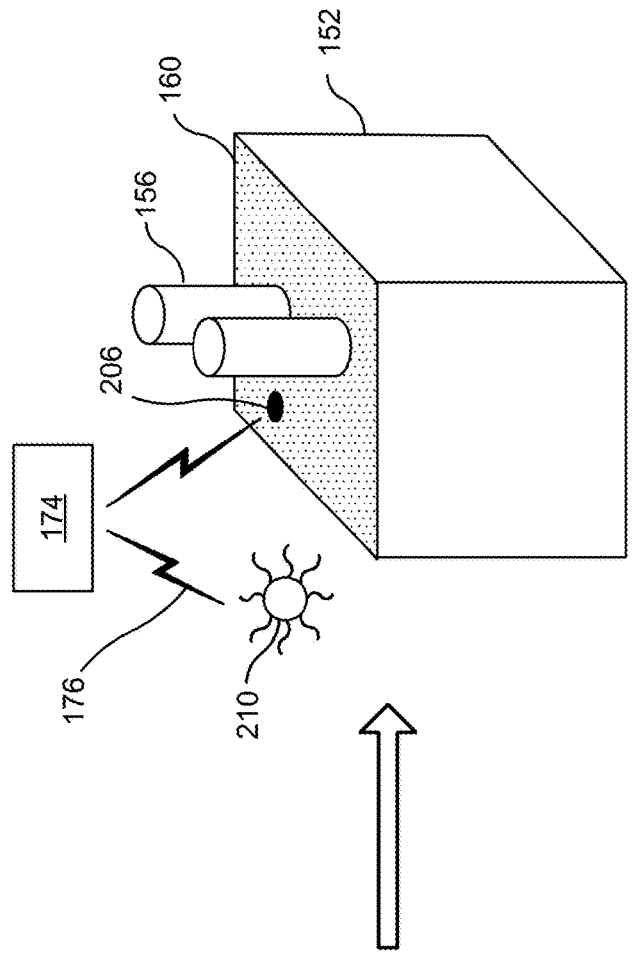
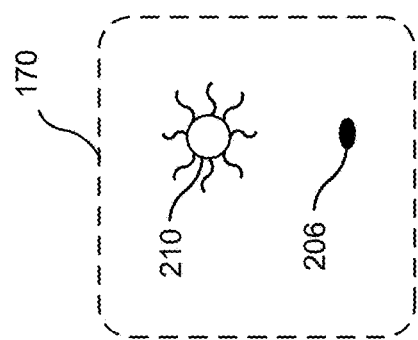
FIG. 2C

SEMICONDUCTOR PROCESSING TOOL AND METHODS OF OPERATION

BACKGROUND

A radiation source, such as an extreme ultraviolet (EUV) radiation source, may include a vessel in which droplets of a target material are subjected to a beam of energy (e.g., a laser beam), which causes the formation of a plasma. The plasma releases energy in the form of EUV light, which is used to pattern photoresist layers on semiconductor substrates as part of semiconductor device fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are diagrams of example implementations of a heating system described herein.

DETAILED DESCRIPTION

Figure 1A:
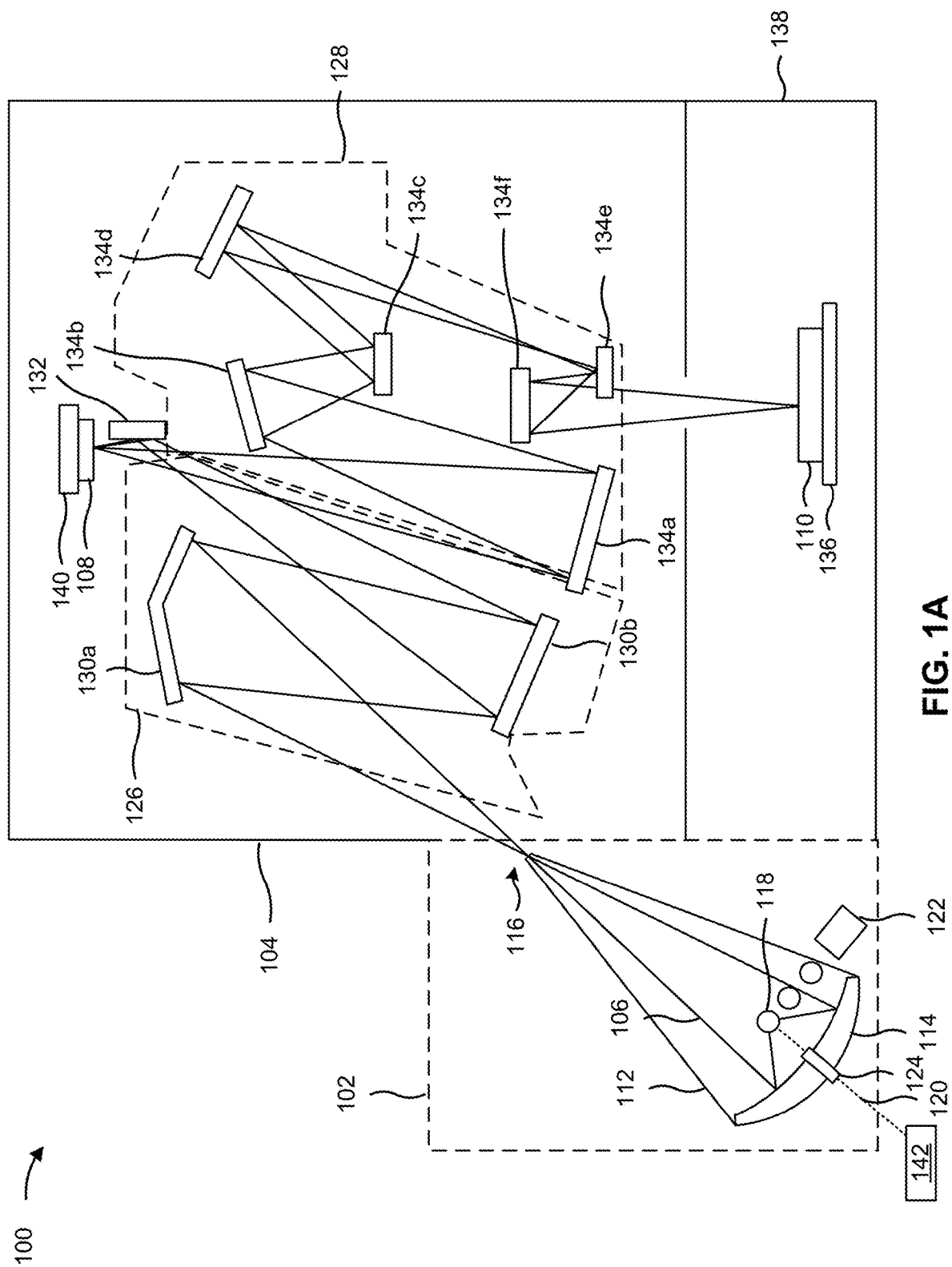
FIGS. 1A-1C are diagrams of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, an interior surface of a vessel of an extreme ultraviolet (EUV) radiation source may collect debris of a target material (e.g., particles from droplets of a target material used to generate a plasma within the vessel). To remove the debris from the interior surface and prevent the debris from spreading to and contaminating the EUV radiation source, the vessel may include vanes and a transport ring that are heated to liquify the debris to create a flow of liquified target material through the vanes, through the transport ring, and into a bucket or another type of receptacle. The liquified target material may flow into the bucket through an opening in a cover of the bucket, or through a conduit that extends through the cover. In some cases, a temperature of the liquified target material may reduce as the liquified target material flows toward the bucket. As a result, the liquified target material may solidify at or near the opening before the liquified target material can flow into the bucket, which may cause a blockage within the conduit and/or a drain port of the transport ring.

A blockage may cause a backflow of the liquified target material that contaminates a surface of a collector in the vessel. Contamination may result in a reduction of EUV light generated by the EUV radiation source (e.g., approximately 2% reduction or greater) to decrease a yield of semiconductor devices manufactured using a lithography system including the EUV radiation source. Subsequently, and in addition to the decrease in the yield of the semiconductor devices, a frequency and an amount of downtime required to clean the EUV radiation source may increase to cause a reduction in a throughput of the semiconductor devices manufactured using the lithography system.

Some implementations described herein incorporate a heating system to heat a cover of a bucket. A liquified target material, collected by vanes and/or a transport ring within a vessel of an EUV radiation source, flows through a drain port of the transport ring and through a conduit that provides the liquified target material to the bucket through an opening of the cover. By heating the cover, the heating system prevents the liquified target material from solidifying at or near the opening before the liquified target material can flow into the bucket. By preventing the solidifying of the liquid target material, a likelihood of a blockage within the conduit and/or the drain port is reduced.

In this way, a likelihood of backflow of the liquified target material caused by a blockage is reduced, which reduces contamination of the collector surface. By reducing contamination on the collector surface, a target dosage of exposure energy (e.g., EUV radiation) by the EUV radiation source may be sustained and a yield of semiconductor devices manufactured using a lithography system including the EUV radiation source may increase. Furthermore, and in addition to the increase in the yield of the semiconductor devices, the frequency and the amount of downtime required to clean the EUV radiation source may reduce, which results in an increase in the throughput of the semiconductor devices manufactured using the lithography system.

Figure 1B:
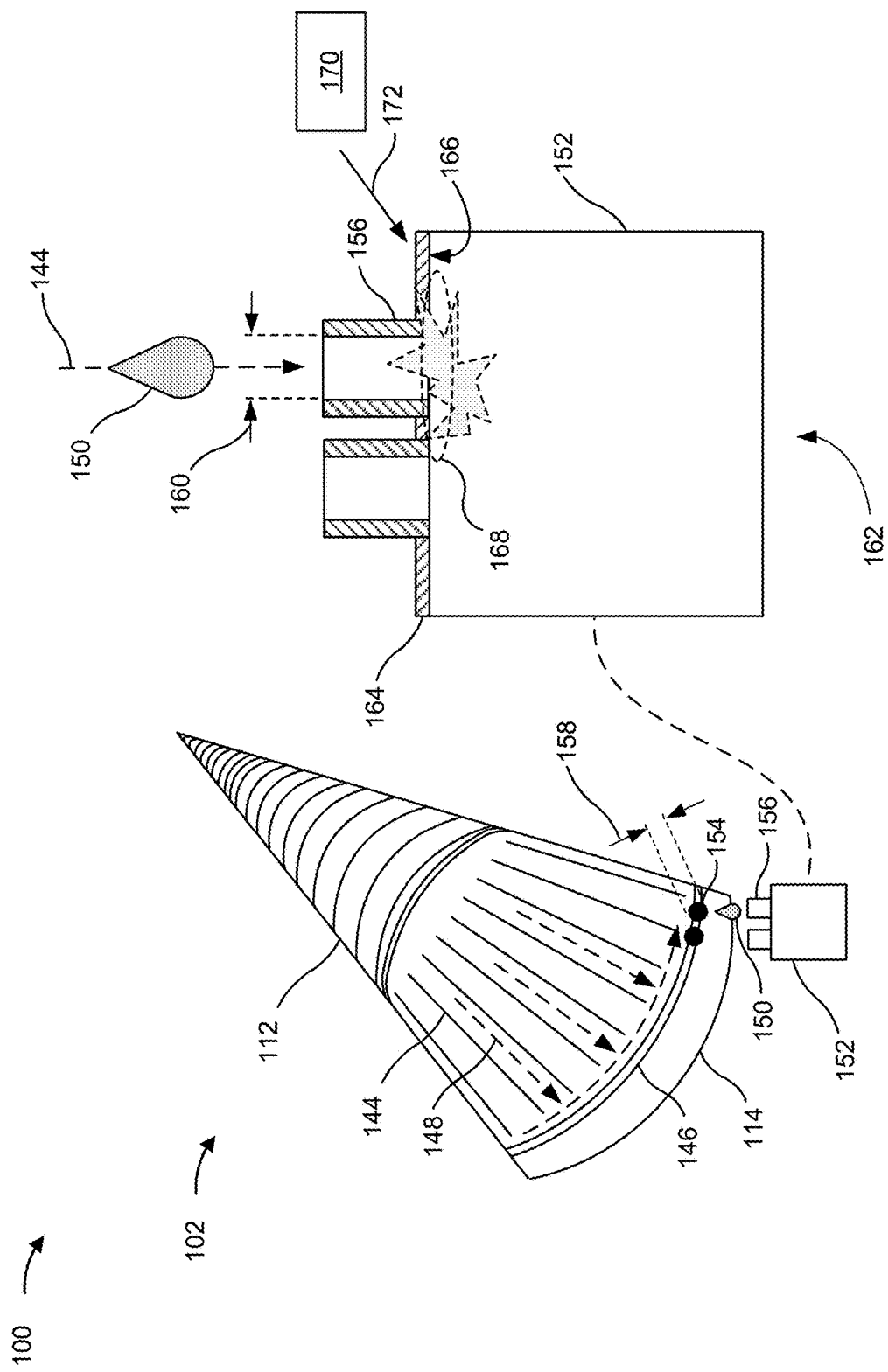
Figure 1C:
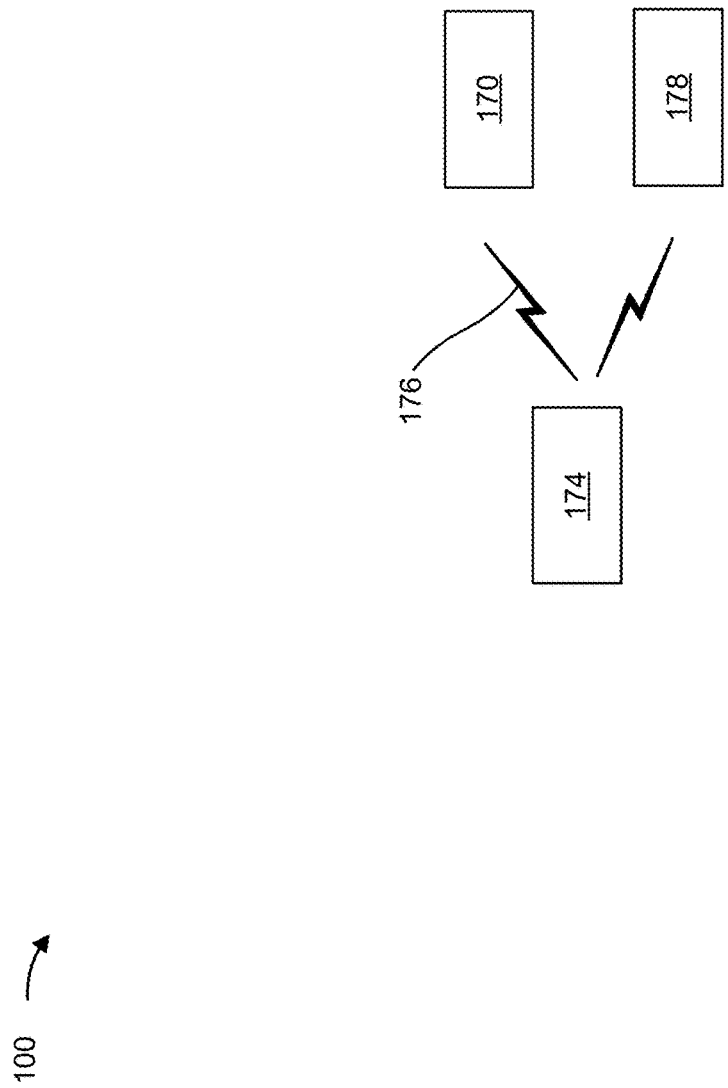

FIGS. 1A-1C are diagrams of an example lithography system 100 described herein. The lithography system 100 of FIGS. 1A-1C includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes the radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104

(e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., tin (Sn) droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide (CO2) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a wafer stage 136 (e.g., a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

The lithography system 100 includes a laser source 142. The laser source 142 is configured to generate the laser beam 120. The laser source 142 may include a CO2-based laser source or another type of laser source. Due to the wavelength of the laser beams generated by a CO2-based laser source in an infrared (IR) region, the laser beams may be highly absorbed by tin, which enables the CO2-based laser source to achieve high power and energy for pumping tin-based plasma. In some implementations, the laser beam 120 includes a plurality of types of laser beams that the laser source 142 generates using a multi-pulse technique (or a multi-stage pumping technique), in which the laser source 142 generates a pre-pulse laser beam and main-pulse laser beam to achieve greater heating efficiency of tin (Sn)-based plasma to increase conversion efficiency.

In an example exposure operation (e.g., an EUV exposure operation), the droplet generator head 122 provides the stream of the droplets 118 across the front of the collector 114. The laser beam 120 contacts the droplets 118, which causes a plasma to be generated. The laser source 142 generates and provides a pre-pulse laser beam toward a target material droplet in the stream of the droplets 118, and the pre-pulse laser beam is absorbed by the target material droplet. This transforms the target material droplet into disc shape or a mist. Subsequently, the laser source 142 provides a main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate the radiation 106 (e.g., EUV light).

The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

FIG. 1B shows additional details of the radiation source 102. The vessel 112 of the radiation source 102 includes one or more vanes 144 and a transport ring 146 (e.g., a tin transport ring or a collector flow ring, among other examples). In some implementations, "spitting" within the vessel 112 during generation of radiation (e.g., the radiation 106) may result in formation of debris (e.g., particles of the droplets 118), which may be collected by an interior surface of the vessel 112.

The one or more vanes 144 and/or the transport ring 146 may be heated (e.g., cyclically, continuously, or based on an event, among other examples) to remove the debris from the interior surface of the vessel 112. The heat causes the debris to liquify, which results in a flow 148 of liquified target material 150. The flow 148 travels along (e.g., down) the one or more vanes 144 to the transport ring 146. The flow 148 then travels along the transport ring 146 (e.g., a channel or gutter within the transport ring 146) and into a bucket 152 where the liquified target material 150 is collected.

The bucket 152 includes a reservoir that is configured to collect the liquified target material 150. The bucket 152 may include a thermally-conductive material that can withstand (e.g., not be damaged by) high temperatures, such as a stainless-steel metal material or a nickel-based alloy material, among other examples. Furthermore, and although shown to include a shape approximating a cubic shape, the bucket 152 may include a shape approximating a cylinder, a shape approximating a truncated cone, or a shape approximating a sphere, among other examples. In some implementations, the bucket 152 has a volumetric capacity (e.g., a capacity for storing a volume of the liquified target material 150) in a range of approximately 15 liters to approximately 25 liters. However, other values and/or ranges of the volumetric capacity are within the scope of the present disclosure.

In some implementations, the bucket 152 is heated to maintain a liquid state of the liquified target material 150 after collection. As an example, if the target material includes a tin material, a heater (e.g., a thermoelectric heater, a convection heater) may heat the bucket 152 to a temperature that is greater than approximately 232 degrees Celsius (° C.) (e.g., the melting point of tin) to maintain the liquid state of the liquified target material 150 after collection. However, other target materials and temperatures (e.g., melting points) are within the scope of the present disclosure.

The liquified target material 150 may flow into the bucket 152 from a drain port 154 included in the transport ring 146 and through a conduit 156 (e.g., a chimney, a tube, or a gutter, among other examples) leading to the bucket 152. In some implementations, and as shown in FIG. 1B, two or more drain ports 154 and/or two or more conduits 156 are included. However, a single drain port 154 and/or a single conduit 156 are within the scope of the present disclosure.

The drain port 154 may include a diameter 158 (e.g., an inner diameter) that is in a range from approximately 2.0 centimeters (cm) to approximately 3.0 cm. By including a diameter in this range, the drain port 154 may accommodate the flow 148 of the liquified target material 150 from the transport ring 146 into the conduit 156. However, other diameters are within the scope of the present disclosure.

The conduit 156 may include a diameter 160 (e.g., an inner diameter) that is in a range from approximately 5.0 cm to approximately 8.0 cm. By including a diameter in this range, the conduit 156 may sufficiently align to the drain port 154 to accommodate the flow 148 of the liquified target material 150 into the bucket 152. However, other diameters are within the scope of the present disclosure.

In some implementations, the conduit 156 includes a ceramic material including a coating that promotes the flow 148 of the liquified target material 150 from the drain port 154 into the bucket 152. However, other materials are within the scope of the present disclosure.

As shown in greater detail in the magnified section view 162 of the bucket 152 on the right side of FIG. 1B, the bucket 152 includes a cover 164. The cover 164, which seals the liquified target material 150 within the bucket 152, may include a thermally-conductive material that can withstand high temperatures, such as a stainless-steel metal material or a nickel-based alloy material, among other examples. The cover 164 may be included to reduce and/or prevent liquified target material 150 from splashing out of the bucket 152, which might otherwise result in contamination of the radiation source 102.

The cover 164 may include an interior surface 166. If a temperature of the interior surface 166 of the cover 164 is below a melting point of the target material, the liquified target material 150 may solidify on the interior surface 166 and may create a blockage. In some implementations, the blockage develops on the interior surface 166 and may accumulate near an opening 168 of the cover 164. The blockage may prevent the liquified target material 150 from flowing into the bucket 152, which may create a backflow of the liquified target material 150 toward the interior of the vessel 112. The backflow may result in contamination of the collector 114, which may reduce an amount of EUV radiation (e.g., the radiation 106) provided from the vessel 112 to the exposure tool 104.

As described in greater detail in connection with FIGS. 2A-2C and elsewhere herein, a heating system 170 may provide heat 172 to the cover 164 to reduce a likelihood of formation of a blockage. To reduce the likelihood of formation of the blockage, the heating system 170 may provide the heat 172 at an energy transfer rate that is in a range from approximately 1000 watts to approximately 2000 watts. By providing the heat 172 within the range, the heating system 170 may provide sufficient energy to prevent the blockage without damaging the cover 164 and/or the bucket 152. However, other ranges and/or values of the rate at which the heating system 170 provides the heat 172 to the cover 164 are within the scope of the present disclosure.

FIG. 1C shows an example controller 174 communicatively connected with the heating system 170 by one or more communication links 176 (e.g., one or more wireless-communication links, one or more wired-communication links, or a combination of one or more wireless-communication links and one or more wired-communication links, among other examples). The controller 174 may include a processor, a combination of a processor and memory, or a transceiver that transmits and receives signals, among other examples. The controller 174 may transmit and receive the signals from one or more components of the heating system 170 using the one or more communication links 176 to cause the heating system 170 to perform processes that reduce the likelihood of a blockage.

For example, the controller 174 may determine that the radiation source 102 is operating. The controller 174 may transmit, based on determining that the radiation source 102 is operating, a signal to activate the heating system 170. Activating the heating system 170 may reduce the likelihood of and/or prevent the liquified target material 150 from solidifying on the interior surface 166 of the cover 164. This reduces the likelihood of and/or prevents an occurrence of a blockage of one or more conduits 156 through which the liquified target material 150 flows into the bucket 152.

As another example, the controller 174 may determine that a likelihood of a blockage is increasing based on a quantity of pulses from the laser source 142 of the EUV radiation source 102. The controller 174 may transmit, based on determining that the likelihood of a blockage is increasing based on the quantity of pulses, a signal to activate the heating system 170.

As another example, the controller 174 may determine that a likelihood of a blockage of the flow 148 of the liquified target material 150 from the one or more vanes 144 and the transport ring 146 of the radiation source 102 source into the bucket 152 of the radiation source 102 is increasing. The controller 174 may, based on determining that the likelihood of a blockage is increasing, determine one or more adjusted settings associated with one or more components of the heating system 170. The one or more adjusted settings may include an adjusted power setting (e.g., a voltage or a current), an adjusted duty-cycle setting, or an adjusted temperature setting of the one or more components, among other examples.

The controller 174 may transmit, based on determining the one or more adjusted settings, a signal indicating the one or more adjusted settings to cause the heating system 170 to change a rate at which the heating system provides the heat 172 to the cover 164. As an example, an increase to a power setting may increase the rate at which the heating system 170 provides the heat 172 to the cover 164. As another example, a decrease to a temperature setting may decrease the rate at which the heating system 170 provides the heat 172 to the cover 164.

In some implementations, the controller 174 determines to adjust the settings of the one or more components based on a machine learning model. The machine learning model may include and/or may be associated with one or more of a neural network model, a random forest model, a clustering model, or a regression model, among other examples. In some implementations, the controller 174 uses the machine learning model to adjust the settings by providing data corresponding to the adjusted settings and/or blockage conditions as input to the machine learning model, and using the machine learning model to determine a likelihood, probability, or confidence that a particular outcome (e.g., a reduction in a likelihood of a blockage, among other examples) for one or more exposure operations will be achieved using the adjusted settings.

The controller 174 (or another system) may train, update, and/or refine the machine learning model to increase the accuracy of the outcomes and/or parameters determined using the machine learning model. The controller 174 may train, update, and/or refine the machine learning model based on feedback and/or results from historical or related exposure operations (e.g., from hundreds, thousands, or more historical or related exposure operations) performed by an exposure tool (e.g., the exposure tool 104 of the lithography system 100, among other examples). As an example, the controller 174 may provide, to the machine learning model, data corresponding to the one or more adjusted settings. In such an example, providing the data to the machine learning model may update an algorithm that correlates the likelihood of a blockage to the settings of the one or more components.

The machine learning model may perform correlations to one or more conditions relating to the likelihood of a blockage. In some implementations, the machine learning model correlates the likelihood of a blockage to parameters associated with the radiation source 102. As an example, the parameters may include an exposure dose, an exposure duration, or a measure of a temperature within the vessel 112. As another example, the parameters may include a type of material used for one or more components of the radiation source 102, an age of the one or more components of the radiation source 102, or a cleanliness of the one or more components of the radiation source 102. As yet another example, the parameters may include a type of material used for the target material.

As another example, in some implementations the machine learning model correlates the likelihood of a blockage to a preventive maintenance record or log. As another example, in some implementations, the machine learning model correlates the likelihood of a blockage to a rate at which the heating system 170 provides the heat 172 to the cover 164.

FIG. 1C also shows the controller 174 communicatively connected to a notification system 178 using the one or more communication links 176. The notification system 178 may include a buzzer, a speaker, a status light, or a display screen, among other examples. In some implementations, one or more portions of the notification system 178 are included as part of the lithography system 100. In some implementations, one or more portions of the notification system 178 are separate from the lithography system 100.

The controller 174 may transmit one or more signals to the notification system 178 to cause the notification system 178 to present an indication of a condition relating to a blockage to an operator, a technician, or an engineer, among other examples. As an example, the controller 174 may transmit a signal to cause the notification system to activate a light to indicate that the likelihood of a blockage is increasing. Additionally, or alternatively, the controller 174 may transmit a signal to cause the notification system 178 to present, through a display screen, data indicating a temperature associated with the cover 164. Additionally, or alternatively, the controller 174 may transmit a signal to cause the notification system 178 to present, through a display screen, data indicating a rate at which the heating system 170 provides the heat 172 to the cover 164.

In some implementations, the notification system 178 provides the indication of the condition relating to the blockage to another device or system. Providing the indication of the condition relating to the blockage may cause the other device or system to update a schedule for, or initiate, a preventive maintenance operation.

As indicated above, FIGS. 1A-1C are provided as examples. Other examples may differ from what is described with regard to FIGS. 1A-1C. For example, another example may include additional components, fewer components, different components, or differently arranged components than those shown in FIGS. 1A-1C. Additionally, or alternatively, a set of components (e.g., one or more components) of FIGS. 1A-1C may perform one or more functions described herein as being performed by another set of components.

Figure 2A:
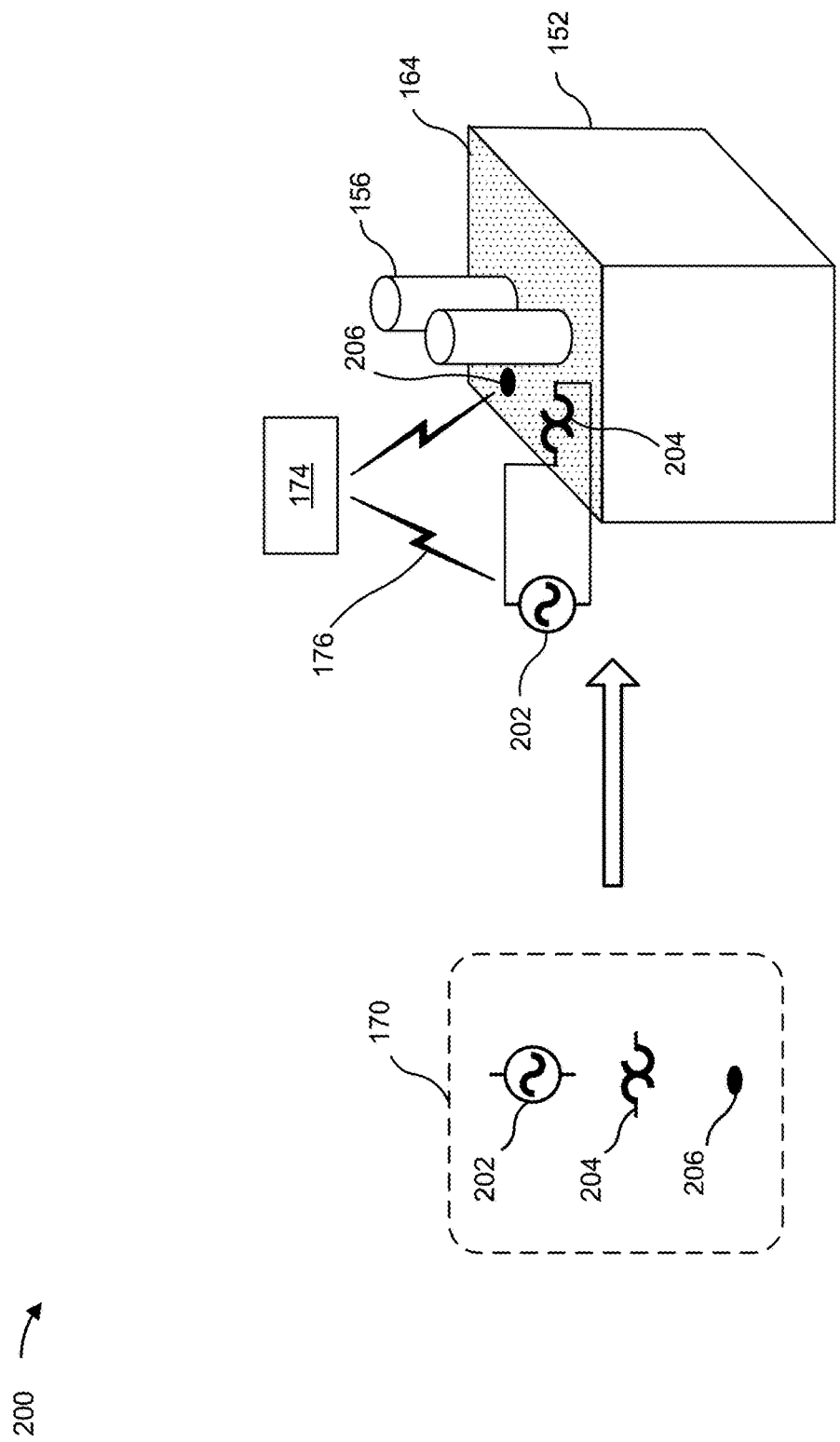

FIG. 2A-2C are diagrams of example implementations 200 of the heating system 170 described herein. The heating system 170 may be included as part of the radiation source 102 (e.g., an EUV radiation source) that includes the vessel 112, the bucket 152, and the conduit 156 between the vessel 112 and the bucket 152. The heating system 170 may be configured to provide the heat 172 to reduce a likelihood of and/or prevent the liquified target material 150 from solidifying and creating a blockage of one or more regions of the conduit 156.

Components of the heating system 170 of FIGS. 2A-2C may receive signals from, or transmit signals to, the controller 174 using the one or more communication links 176.

FIG. 2A shows an example implementation 200 of the heating system 170. In FIG. 2A, components of the heating system 170 include a power supply 202, a heat-generating conduction component 204, and a temperature sensor 206.

The power supply 202 may supply power (e.g., an amount of an electrical voltage and/or an electrical current) to the heat-generating conduction component 204. The heat-generating conduction component 204 may include a thermoelectric device, a conduction heater, and/or another type of device that generates the heat 172. The heat-generating conduction component 204 may provide the heat 172 to the cover 164 directly and/or indirectly. The heat-generating conduction component 204 may provide the heat 172 to the cover 164 using conduction heat-transfer mechanics and/or other heat-transfer mechanics.

The temperature sensor 206, which may be attached to the cover 164, may include a thermistor device or a thermocouple device, among other examples. The temperature sensor 206 is configured to generate sensor data associated with a temperature (e.g., a measured temperature) of the cover 164. For example, the temperature sensor 206 may be configured to generate sensor data associated with a temperature of an inner surface of the cover 164.

In the implementation of FIG. 2A, the controller 174 may transmit one or more signals to, or receive one or more signals from, the temperature sensor 206 using the one or more communication links 176. As an example, the controller 174 may receive a signal from the temperature sensor 206 that includes data corresponding to the temperature of the cover 164. The controller 174 may determine, based on the data, whether the temperature of the cover 164 satisfies a threshold. For example, the controller 174 may determine whether the temperature of the cover 164 is less than a melting temperature of a target material. Additionally, or alternatively, the controller 174 may determine whether the temperature of the cover 164 is greater than a temperature that causes damage to the cover 164 and/or the bucket 152. Additionally, or alternatively, the controller 174 may determine whether a rate of change of the temperature of the cover 164 is less than a rate of change that causes thermal shock, among other examples.

Continuing with the example implementation of FIG. 2A, the controller 174 may transmit one or more signals to, or receive one or more signals from, the power supply 202 using the one or more communication links 176. As an example, the controller 174 may transmit a signal indicating an adjusted setting to the power supply 202. The adjusted setting may increase an amount of power supplied to the heat-generating conduction component 204 to increase a rate at which the heating system 170 provides the heat 172 to the cover 164. Alternatively, the adjusted setting may decrease the amount of power supplied to the heat-generating conduction component 204 to decrease the rate at which the heating system 170 provides the heat 172 to the cover 164.

FIG. 2B shows another example implementation of the heating system 170. In FIG. 2B, components of the heating system 170 include the temperature sensor 206 and a heat-generating convection component 208. The heat-generating convection component 208 may include one or more combinations of a heat source, a fluid source, a flow-generating component, and/or convective surfaces, among other examples. As an example, the heat-generating convection component 208 may include a combination of a resistive heating element, a fan, and a heat sink having fins. As another example, the heat-generating convection component 208 may include a heated liquid source, a pump, and a liquid jacket. The heat-generating convection component 208 may directly and/or indirectly provide the heat 172 to the cover 164 using convection heat-transfer mechanics and/or heat-transfer mechanics.

Continuing with the implementation of FIG. 2B, the controller 174 may transmit one or more signals to, or receive one or more signals from, the heat-generating convection component 208 using the one or more communication links 176. As an example, the controller 174 may transmit a signal indicating an adjusted setting to the heat-generating convection component 208. The adjusted setting may increase a temperature of a fluid (e.g., air or another gas, among other examples) provided by the heat-generating convection component 208 or a rate of a flow of the fluid provided by the heat-generating convection component 208 to increase a rate at which the heating system 170 provides the heat 172 to the cover 164. Alternatively, the adjusted setting may decrease the temperature of the fluid or rate of flow of the fluid provided by the heat-generating convection component 208 to decrease the rate at which the heating system 170 provides the heat 172 to the cover 164.

FIG. 2C shows another example implementation of the heating system 170. In FIG. 2C, components of the heating system 170 include the temperature sensor 206 and a heat-generating radiation component 210. The heat-generating radiation component 210 may include an infrared radiation source, among other examples. The heat-generating radiation component 210 may directly or indirectly provide the heat 172 to the cover 164 using radiation heat-transfer mechanics and/or other heat-transfer mechanics.

Continuing with the implementation of FIG. 2C, the controller 174 may transmit one or more signals to, or receive one or more signals from, the heat-generating radiation component 210 using the one or more communication links 176. As an example, the controller 174 may transmit a signal indicating an adjusted setting to the heat-generating radiation component 210. The adjusted setting may increase an amount of radiation generated by the heat-generating radiation component 210 to increase a rate at which the heating system 170 provides the heat 172 to the cover 164. Alternatively, the adjusted setting may decrease the amount of radiation generated by the heat-generating radiation component 210 to decrease the rate at which the heating system 170 provides the heat 172 to the cover 164.

In some implementations, the heating system 170 uses a combination of one or more of the heat-generating components of FIGS. 2A-2C (e.g., one or more of the heat-generating conduction component 204, the heat-generating convection component 208, or the heat-generating radiation component 210). In such implementations, each heat-generating component of the combination may provide a different portion of the heat 172 to the cover 164.

Although the heating system 170 may provide the heat 172 to the cover 164 at an exterior surface of the cover, the heat 172 may increase a temperature of an interior surface 166 of the cover 164 (e.g., increase the temperature using conduction heat-transfer mechanics between the exterior surface and the interior surface 166). Furthermore, in some implementations, the heating system 170 provides the heat 172 (or portions of the heat 172) to the conduit 156 and/or the drain port 154.

As indicated above, FIGS. 2A-2C are provided as examples. Other examples may differ from what is described with regard to FIGS. 2A-2C. For example, another example may include additional components, fewer components, different components, or differently arranged components than those shown in FIGS. 2A-2C. Additionally, or alternatively, a set of components (e.g., one or more components) of FIGS. 2A-2C may perform one or more functions described herein as being performed by another set of components.

Figure 3:
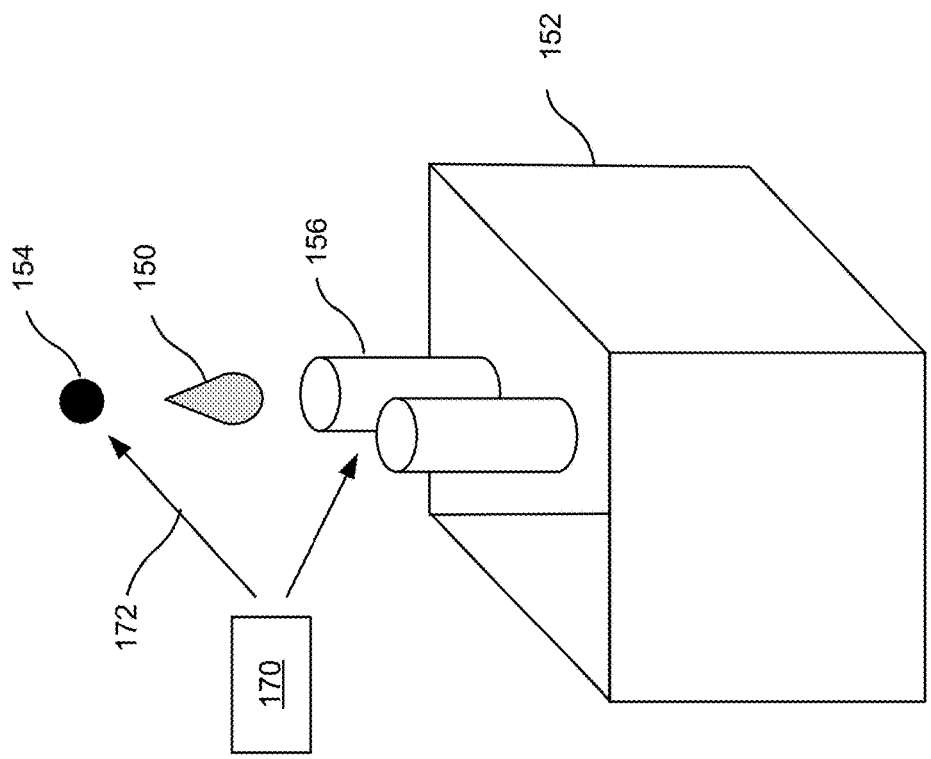
FIG. 3 is a diagram of an example implementation described herein.

FIG. 3 is a diagram of an example implementation 300 described herein. In the example implementation 300, the heating system 170 is configured to provide the heat 172 to the drain port 154 and/or the conduit 156 to increase and maintain respective temperatures of the drain port and/or the conduit such that the respective temperatures satisfy one or more thresholds (e.g., above a melting temperature of the liquified target material 150). In this way, the heating system 170 may reduce the likelihood of a blockage in the drain port 154 and/or the conduit 156.

As a result of the heating system 170 being configured to provide the heat 172 to the drain port 154 and/or the conduit 156, the cover 164 may be omitted from the bucket 152. In the absence of the cover 164, the liquified target material 150 may flow through the conduit 156 directly into the bucket 152. The absence of an upper surface near an exit of the conduit 156 into the bucket 152 (e.g., which would otherwise be provided by the cover 164) reduces the likelihood of a blockage in the conduit 156. Moreover, the cover 164 being omitted reduces the complexity of the bucket 152.

As indicated above, FIG. 3 is provided as an example. Other examples may differ from what is described with regard to FIG. 3.

Figure 4:
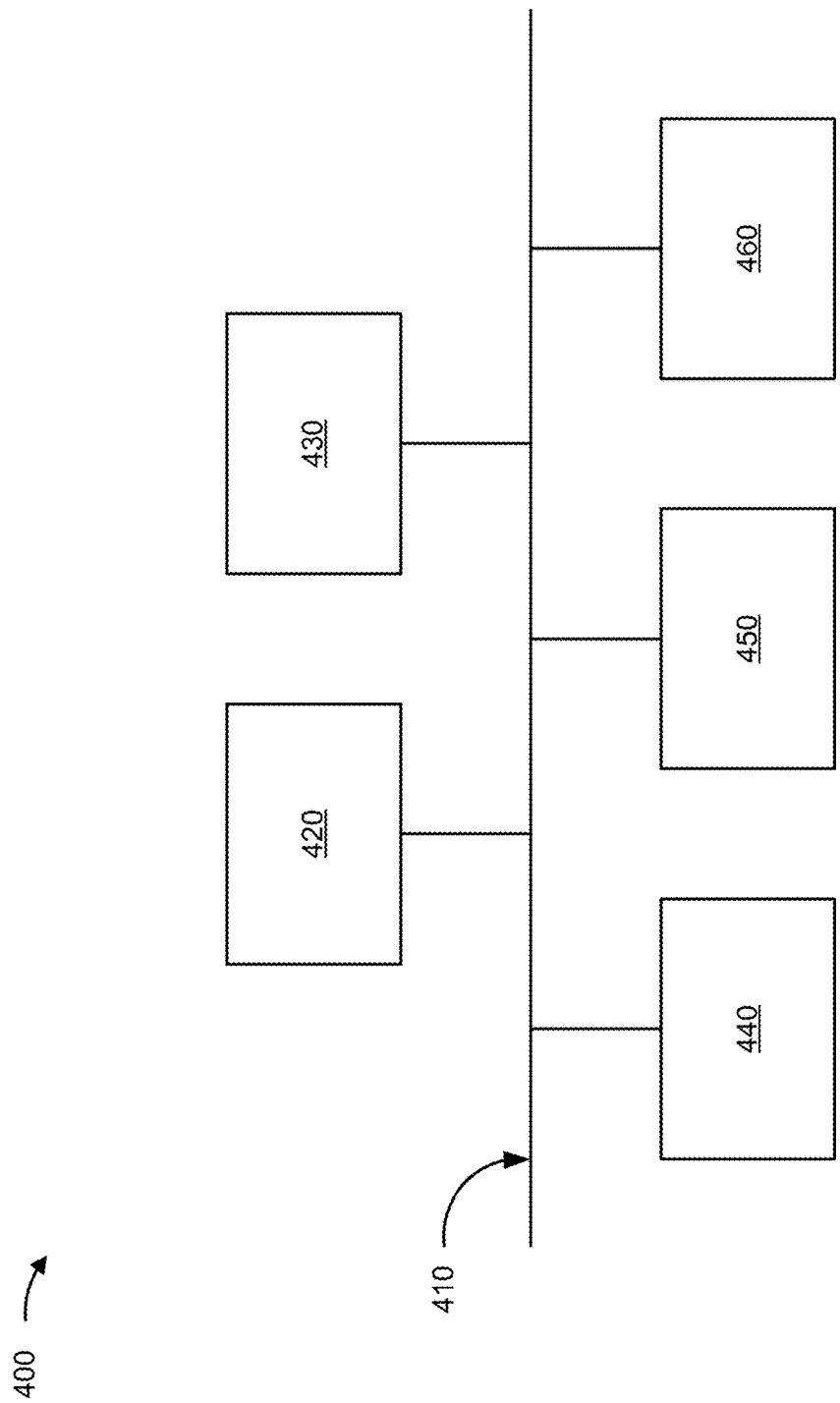
FIG. 4 is a diagram of example components of one or more devices described herein.

FIG. 4 is a diagram of example components of one or more devices 400 described herein. The device 400 may correspond to the lithography system 100 and/or the radiation source 102. In some implementations, the heating system 170, the controller 174, and/or the notification system 178 include one or more devices 400 and/or one or more components of device 400. As shown in FIG. 4, device 400 may include a bus 410, a processor 420, a memory 430, an input component 440, an output component 450, and a communication component 460.

Bus 410 includes one or more components that enable wired and/or wireless communication among the components of device 400. Bus 410 may couple together two or more components of FIG. 4, such as via operative coupling, communicative coupling, electronic coupling, and/or electric coupling. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform one or more operations or processes described elsewhere herein.

Memory 430 includes volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 includes one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry is used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
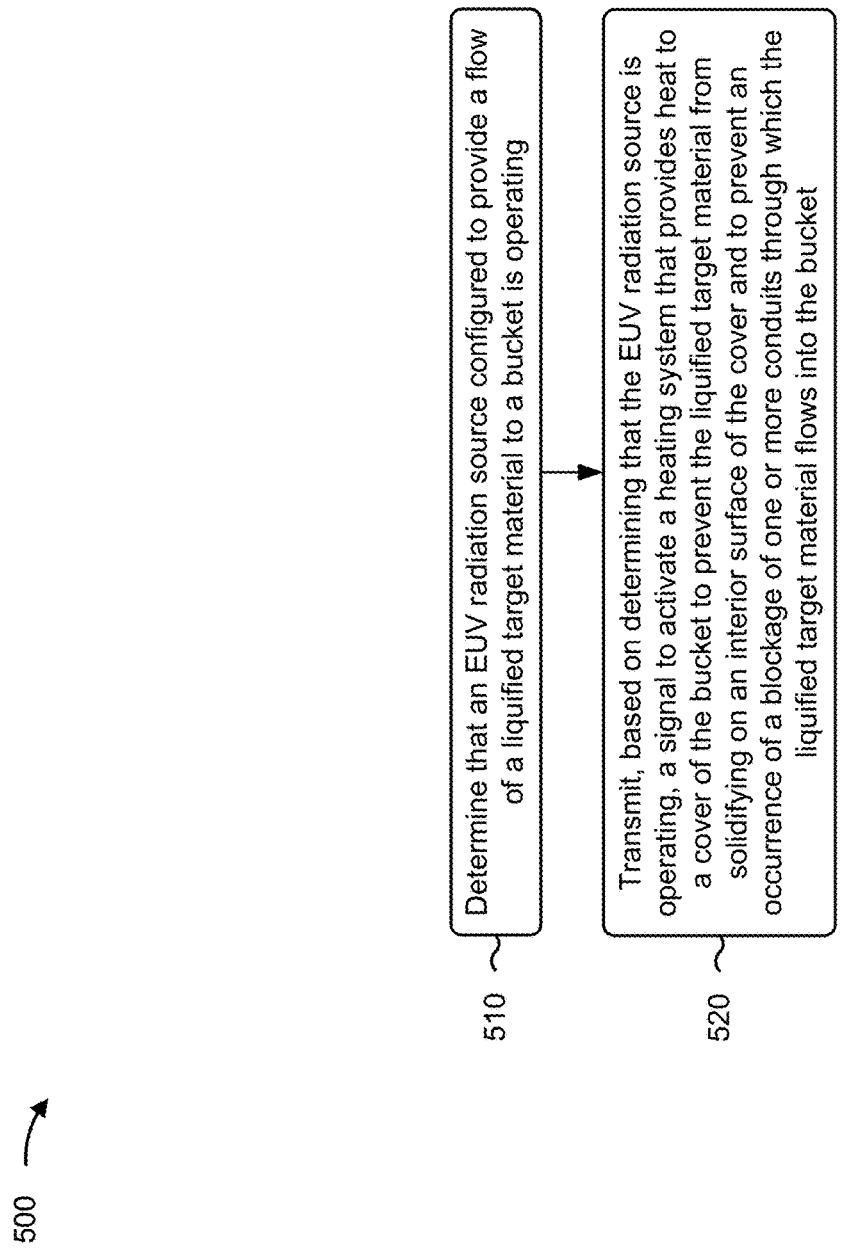
FIGS. 5 and 6 are flowcharts of example processes relating to operating a heating system described herein.

FIG. 5 is a flowchart of an example process relating to operating the heating system 170 described herein. In some implementations, one or more process blocks of FIG. 5 are performed by a lithography system (e.g., lithography system 100), such as a controller (e.g., controller 174) of the lithography system. In some implementations, one or more process blocks of FIG. 5 are performed by another device or a group of devices separate from or including the lithography system, such as a radiation source (e.g., EUV radiation source 102), a heating system (e.g., heating system 170), and/or a notification system (e.g., notification system 178). Additionally, or alternatively, one or more process blocks of FIG. 5 may be performed by one or more components of device 400, such as processor 420, memory 430, input component 440, output component 450, and/or communication component 460.

As shown in FIG. 5, process 500 may include determining that an EUV radiation source configured to provide a flow of a liquified target material to a bucket is operating (block 510). For example, the controller 174 may determine that an EUV radiation source 102 configured to provide a flow of a liquified target material 150 to a bucket 152 is operating, as described above.

As further shown in FIG. 5, process 500 may include transmitting, based on determining that the EUV radiation source is operating, a signal to activate a heating system that provides heat to a cover of the bucket to prevent the liquified target material from solidifying on an interior surface 166 of the cover and to prevent an occurrence of a blockage of one or more conduits through which the liquified target material flows into the bucket (block 520). For example, the controller 174 may transmit, based on determining that the EUV radiation source 102 is operating, a signal to activate a heating system 170 that provides heat 172 to a cover 164 of the bucket 152 to prevent the liquified target material 150 from solidifying on an interior surface 166 of the cover 164 and to prevent an occurrence of a blockage of one or more conduits 156 through which the liquified target material 150 flows into the bucket 152, as described above.

Process 500 may include additional implementations, such as any single implementation or any combination of implementations described below and/or in connection with one or more other processes described elsewhere herein.

In a first implementation, transmitting the signal to activate the heating system 170 includes transmitting an indication of one or more power settings for the heating system 170 to control a rate at which the heat 172 is provided to the cover 164 by the heating system 170, to within a range from approximately 1000 watts to approximately 2000 watts.

In a second implementation, alone or in combination with the first implementation, process 500 includes receiving, from a temperature sensor 206 coupled to the cover 164, data and determining, based on the data, that a temperature of the cover 164 does not satisfy a threshold, and transmitting, based on determining that the temperature of the cover 164 does not satisfy the threshold, another signal to the heating system 170 to increase a rate at which heating system 170 provides the heat 172 to the cover 164.

In a third implementation, alone or in combination with one or more of the first and second implementations, determining that the temperature of the cover 164 does not satisfy the threshold includes determining that the temperature of the cover 164 is less than a melting temperature of a material included in the liquified target material 150.

In a fourth implementation, alone or in combination with one or more of the first through third implementations, process 500 includes receiving, from a temperature sensor 206 coupled to the cover 164, data and determining, based on the data, that a temperature of the cover 164 does not satisfy a threshold, and transmitting, after determining that the temperature of the cover 164 does not satisfy the threshold, another signal to the heating system 170 to decrease a rate at which the heating system provides the heat to the cover.

In a fifth implementation, alone or in combination with one or more of the first through fourth implementations, determining that the temperature of the cover 164 does not satisfy the threshold includes determining that the temperature of the cover 164 is greater than a temperature that causes damage to the cover 164 or the bucket 152.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Figure 6:
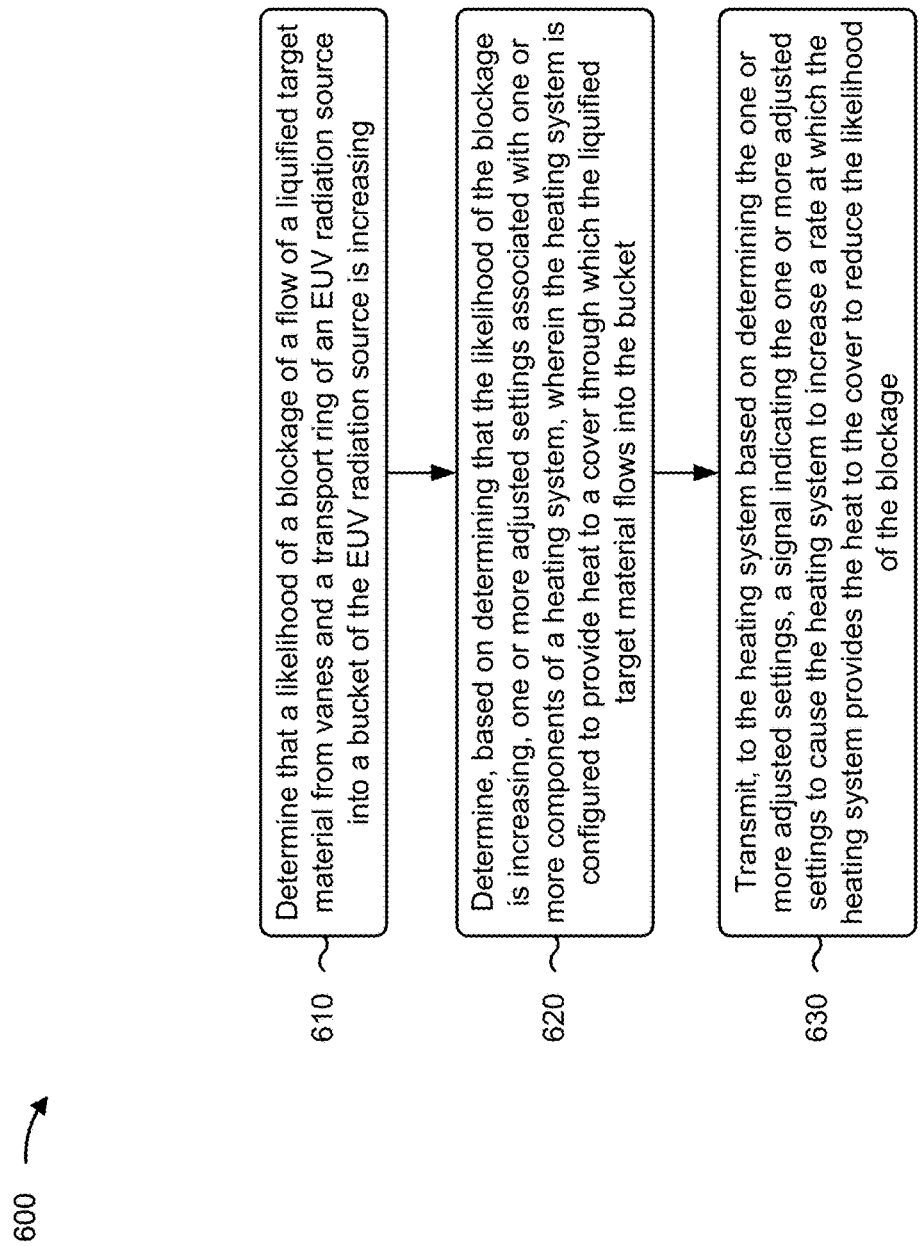

FIG. 6 is a flowchart of an example processes relating to operating the heating system 170 described herein. In some implementations, one or more process blocks of FIG. 6 are performed by a lithography system (e.g., lithography system 100), such as a controller (e.g., controller 174) of the lithography system. In some implementations, one or more process blocks of FIG. 6 are performed by another device or a group of devices separate from or including the lithography system, such as a radiation source (e.g., EUV radiation source 102), a heating system (e.g., heating system 170), and/or a notification system (e.g., notification system 178). Additionally, or alternatively, one or more process blocks of FIG. 6 may be performed by one or more components of device 400, such as processor 420, memory 430, input component 440, output component 450, and/or communication component 460.

As shown in FIG. 6, process 600 may include determining that a likelihood of a blockage of a flow of a liquified target material from vanes and a transport ring of an EUV radiation source into a bucket of the EUV radiation source is increasing (block 610). For example, the controller 174 may determine that a likelihood of a blockage of a flow 148 of a liquified target material 150 from vanes 144 and a transport ring 146 of an EUV radiation source 102 into a bucket 152 of the EUV radiation source 102 is increasing, as described above.

As further shown in FIG. 6, process 600 may include determining one or more adjusted settings associated with one or more components of a heating system (block 620). For example, the controller 174 may determine one or more adjusted settings associated with one or more components of a heating system 170. In some implementations, the heating system 170 is configured to provide heat 172 to a cover 164 through which the liquified target material 150 flows into the bucket 152.

As further shown in FIG. 6, process 600 may include transmitting a signal indicating the one or more adjusted settings to cause the heating system to increase a rate at which the heating system provides the heat to the cover to reduce the likelihood of a blockage (block 630). For example, the controller 174 may transmit a signal indicating the one or more adjusted settings to cause the heating system 170 to increase a rate at which the heating system 170 provides the heat 172 to the cover 164 to reduce the likelihood of a blockage, as described above.

Process 600 may include additional implementations, such as any single implementation or any combination of implementations described below and/or in connection with one or more other processes described elsewhere herein.

In a first implementation, determining that the likelihood of a blockage is increasing includes receiving, at a first time from a temperature sensor 206, first data, receiving, at a second time from the temperature sensor 206, second data, and determining, based on the first data and the second data, that a rate of change of a temperature of the cover 164 does not satisfy a threshold.

In a second implementation, alone or in combination with the first implementation, determining that the likelihood of a blockage is increasing includes receiving, from a temperature sensor 206, data corresponding to a temperature near an opening 168 of the cover 164 through which a conduit 156 is configured to provide the liquified target material 150 into the bucket 152, and determining, based on the data, that the temperature near the opening 168 does not satisfy a threshold.

In a third implementation, alone or in combination with one or more of the first and second implementations, determining that the likelihood of a blockage is increasing includes determining that the likelihood of a blockage is increasing based on a machine learning model that correlates the likelihood of a blockage to one or more parameters associated with the EUV radiation source 102.

In a fourth implementation, alone or in combination with one or more of the first through third implementations, determining that the likelihood of a blockage is increasing includes determining that the likelihood of a blockage is increasing based on a quantity of pulses from a laser source 142 of the EUV radiation source 102.

In a fifth implementation, alone or in combination with one or more of the first through fourth implementations, process 600 includes providing, to a machine learning model based on determining the one or more adjusted settings, data corresponding to the one or more adjusted settings, and using the data to update an algorithm of the machine learning model that correlates the likelihood of a blockage to the rate at which the heating system 170 provides the heat 172 to the cover.

In a sixth implementation, alone or in combination with one or more of the first through fifth implementations, process 600 includes transmitting, to a notification system 178 after transmitting the signal, another signal to cause the notification system 178 to present an indication that the likelihood of a blockage is increasing.

In a seventh implementation, alone or in combination with one or more of the first through sixth implementations, process 600 includes transmitting, to a notification system 178 after transmitting the signal, another signal to cause the notification system 178 to present an indication to clean a conduit 156 configured to provide the liquified target material 150 into the bucket 152.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Some implementations described herein incorporate a heating system to heat a cover of a bucket. A liquified target material, collected by vanes and/or a transport ring within a vessel of an EUV radiation source, flows through a drain port of the transport ring and through a conduit that provides the liquified target material to the bucket through an opening of the cover. By heating the cover, the heating system prevents the liquified target material from solidifying at or near the opening before the liquified target material can flow into the bucket. By preventing the solidifying of the liquid target material, a likelihood of a blockage within the conduit and/or the drain port is reduced.

In this way, a likelihood of backflow of the liquified target material caused by a blockage is reduced, which reduces contamination of the collector surface. By reducing contamination on the collector surface, a target dosage of exposure energy (e.g., EUV radiation) by the EUV radiation source may be sustained and a yield of semiconductor devices manufactured using a lithography system including the EUV radiation source may increase. Furthermore, and in addition to the increase in the yield of the semiconductor devices, the frequency and the amount of downtime required to clean the EUV radiation source may reduce, which results in an increase in the throughput of the semiconductor devices manufactured using the lithography system.

As described in greater detail above, some implementations described herein provide a method. The method includes determining, by a controller, that an EUV radiation source configured to provide a flow of a liquified target material to a bucket is operating. The method includes transmitting, by the controller based on determining that the EUV radiation source is operating, a signal to activate a heating system that provides heat to a cover of the bucket, prevent the liquified target material from solidifying on an interior surface of the cover prevent an occurrence of a blockage of one or more conduits through which the liquified target material flows into the bucket.

As described in greater detail above, some implementations described herein provide a method. The method includes determining, by a controller, that a likelihood of a blockage of a flow of a liquified target material from vanes and a transport ring of an EUV radiation source into a bucket of the EUV radiation source is increasing. The method includes determining, by the controller based on determining that the likelihood of a blockage is increasing, one or more adjusted settings associated with one or more components of a heating system, where the heating system is configured to provide heat to a cover through which the liquified target material flows into the bucket. The method includes transmitting, by the controller to the heating system based on determining the one or more adjusted settings, a signal indicating the one or more adjusted settings to cause the heating system to increase a rate at which the heating system provides the heat to the cover to reduce the likelihood of a blockage.

As described in greater detail above, some implementations described herein provide an EUV radiation source. The EUV radiation source includes a vessel. The EUV radiation source includes a bucket configured to collect a liquified target material from the vessel. The EUV radiation source includes a conduit between the vessel and the bucket. The EUV radiation source includes a heating system configured to provide heat to prevent the liquified target material from solidifying and creating a blockage of the conduit.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining, by a controller, that an extreme ultraviolet (EUV) radiation source configured to provide a flow of a liquified target material from a drain port of a transport ring directly to a bucket is operating;
   receiving, by the controller and based on determining that the EUV radiation source is operating, data, from a temperature sensor of a cover of the bucket, indicating a temperature of an interior surface of the cover;
   transmitting, by the controller based on receiving the data, a signal to activate a heating system that provides a heat to the cover to:

prevent the liquified target material from solidifying on the interior surface of the cover; and prevent an occurrence of a blockage of one or more conduits through which the liquified target material flows into the bucket, wherein the heating system includes a heat-generating component in the cover.

2. The method of claim 1, wherein transmitting the signal to activate the heating system comprises:

transmitting an indication of one or more power settings, for the heating system to control a rate at which the heat is provided to the cover by the heating system, to within a range from approximately 1000 watts to approximately 2000 watts.

3. The method of claim 1, further comprising:

determining, based on the data, that a temperature of the cover does not satisfy a threshold; and transmitting, based on determining that the temperature of the cover does not satisfy the threshold, another signal to the heating system to increase a rate at which the heating system provides the heat to the cover.

4. The method of claim 3, wherein determining that the temperature of the cover does not satisfy the threshold comprises:

determining that the temperature of the cover is less than a melting temperature of a material included in the liquified target material.

5. The method of claim 1, further comprising:

determining, based on the data, that a temperature of the cover does not satisfy a threshold; and transmitting, after determining that the temperature of the cover does not satisfy the threshold, another signal to the heating system to decrease a rate at which the heating system provides the heat to the cover.

6. The method of claim 5, wherein determining that the temperature of the cover does not satisfy the threshold comprises:

determining that the temperature of the cover is greater than a second temperature that causes damage to the cover or the bucket.

7. A method, comprising:

receiving, by a controller and from a temperature sensor of a cover of a bucket, data indicating a temperature of an interior surface of the cover;

determining, by the controller and based on the data, that a likelihood of a blockage of a flow of a liquified target material from a drain port of a transport ring of an extreme ultraviolet (EUV) radiation source directly into the bucket is increasing;

determining, by the controller based on determining that the likelihood of the blockage is increasing, one or more adjusted settings associated with a component of a heating system, wherein the component is different from the temperature sensor, wherein the heating system includes a heat-generating component in the cover, and wherein the heating system is configured to provide heat to the cover through which the liquified target material flows into the bucket; and transmitting, by the controller to the heating system based on determining the one or more adjusted settings, a signal indicating the one or more adjusted settings to cause the heating system to increase a rate of change at which the heating system provides the heat to the cover to reduce the likelihood of the blockage.

8. The method of claim 7, wherein the data is received at a first time, and the method further comprising:

receiving, from the temperature sensor and at a second time before the first time, second data indicating a second temperature of the interior surface of the cover; and determining, based on the data and the second data, that the rate of change does not satisfy a threshold.

9. The method of claim 7, wherein the interior surface of the cover is near an opening of the cover through which a conduit is configured to provide the liquified target material into the bucket.

10. The method of claim 7, wherein determining that the likelihood of the blockage is increasing comprises:

determining that the likelihood of the blockage is increasing based on a machine learning model that correlates the likelihood of the blockage to one or more parameters associated with the EUV radiation source.

11. The method of claim 7, wherein determining that the likelihood of the blockage is increasing comprises:

determining that the likelihood of the blockage is increasing based on a quantity of pulses from a laser source of the EUV radiation source.

12. The method of claim 7, further comprising:

providing, to a machine learning model and based on determining the one or more adjusted settings, data corresponding to the one or more adjusted settings; and using the data to update an algorithm of the machine learning model that correlates the likelihood of the blockage to settings of the component of the heating system.

13. The method of claim 7, further comprising:

transmitting, to a notification system after transmitting the signal, another signal to cause the notification system to present an indication that the likelihood of the blockage is increasing.

14. The method of claim 7, further comprising:

transmitting, to a notification system after transmitting the signal, another signal to cause the notification system to present an indication to clean a conduit configured to provide the liquified target material into the bucket.

15. An extreme ultraviolet (EUV) radiation source, comprising:

a vessel;

a bucket configured to collect a liquified target material from the vessel;

a conduit between the vessel and the bucket;

a transport ring including a drain port through which the liquified target material flows directly into the conduit;

a heating system configured to provide a heat to prevent the liquified target material from solidifying and creating a blockage of the conduit, wherein the heating system includes a heat-generating component in a cover of the bucket, and a temperature sensor in the cover of the bucket; and a controller configured to:

receive, from the temperature sensor, data indicating a temperature of an interior surface of the cover, and transmit a signal to activate the heat-generating component.

16. The EUV radiation source of claim 15, wherein the cover includes an opening through which the conduit is configured to provide the liquified target material into the bucket.

17. The EUV radiation source of claim 16, wherein the heat-generating component is a heat-generating conduction component configured to provide, using conduction heat-transfer mechanics, at least a portion of the heat to the cover of the bucket to increase a temperature of the interior surface of the cover near the opening.

18. The EUV radiation source of claim 16, wherein the heat-generating component is a heat-generating convection component configured to provide, using convection heat-transfer mechanics, at least a portion of the heat to the cover to increase a temperature of the interior surface of the cover near the opening.

19. The EUV radiation source of claim 16, wherein the heat-generating component is a heat-generating radiation component configured to provide, using radiation heat-transfer mechanics, at least a portion of the heat to the cover to increase a temperature of the interior surface of the cover near the opening.

20. The EUV radiation source of claim 15, wherein the heating system is configured to provide a heat within a range from approximately 1000 watts to approximately 2000 watts.

* * * * *